United States Patent [19]
Medina et al.

[11] Patent Number: 5,975,944
[45] Date of Patent: Nov. 2, 1999

[54] CONNECTOR FOR PITCH SPACED ELECTRICAL CABLES

[75] Inventors: Thomas John Medina, Portland; Paul Christian Sprunger, Dundee, both of Oreg.

[73] Assignee: The Whitaker Corporation, Wilmington, Del.

[21] Appl. No.: 08/878,561

[22] Filed: Jun. 19, 1997

Related U.S. Application Data

[60] Provisional application No. 60/020,672, Jun. 28, 1996.

[51] Int. Cl.⁶ ........................................ H01R 9/07
[52] U.S. Cl. ........................ 439/493; 439/497; 439/912
[58] Field of Search ..................... 439/67, 77, 493–494, 439/497, 579, 912; 174/52.4, 74 R, 201, 261, 250, 253, 268, 259, 117 F; 29/828, 829, 842, 843, 884

[56] References Cited

U.S. PATENT DOCUMENTS

| | | | |
|---|---|---|---|
| 4,750,266 | 6/1988 | Brandeau | 439/494 |
| 5,026,291 | 6/1991 | David | 439/67 |
| 5,347,711 | 9/1994 | Wheatcraft et al. | 29/843 |
| 5,387,764 | 2/1995 | Blom et al. | 174/261 |
| 5,482,047 | 1/1996 | Nordgren et al. | 128/662.03 |
| 5,710,393 | 1/1998 | Smith et al. | 174/74 R |
| 5,734,559 | 3/1998 | Banerjee et al. | 174/52.4 |
| 5,781,991 | 7/1998 | Papon | 29/828 |
| 5,844,783 | 12/1998 | Kojima | 439/67 |

*Primary Examiner*—Neil Abrams
*Attorney, Agent, or Firm*—Gerald K. Kita

[57] ABSTRACT

An electrical connector (1) constructed with a carrier (2) on which circuit traces (8) attach to signal transmitting conductors (4) of electrical cables (3), an opening (12) through the carrier (2) at which conductors (4) of the cables (3) project for electrical connection to an electrical circuit positioned at the opening (12), and the traces (8) having different portions (15,21,24) that are spaced apart on different pitch spacing for connection to respective signal transmitting conductors that are spaced apart on corresponding different pitch spacings. The traces (8) may include test pads (13) in registration with windows (19) in the carrier (2).

7 Claims, 4 Drawing Sheets

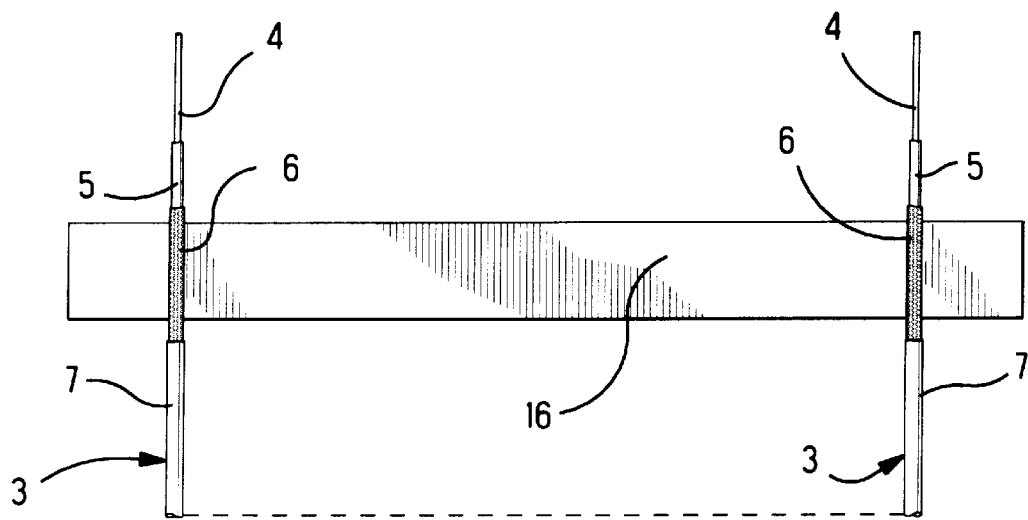
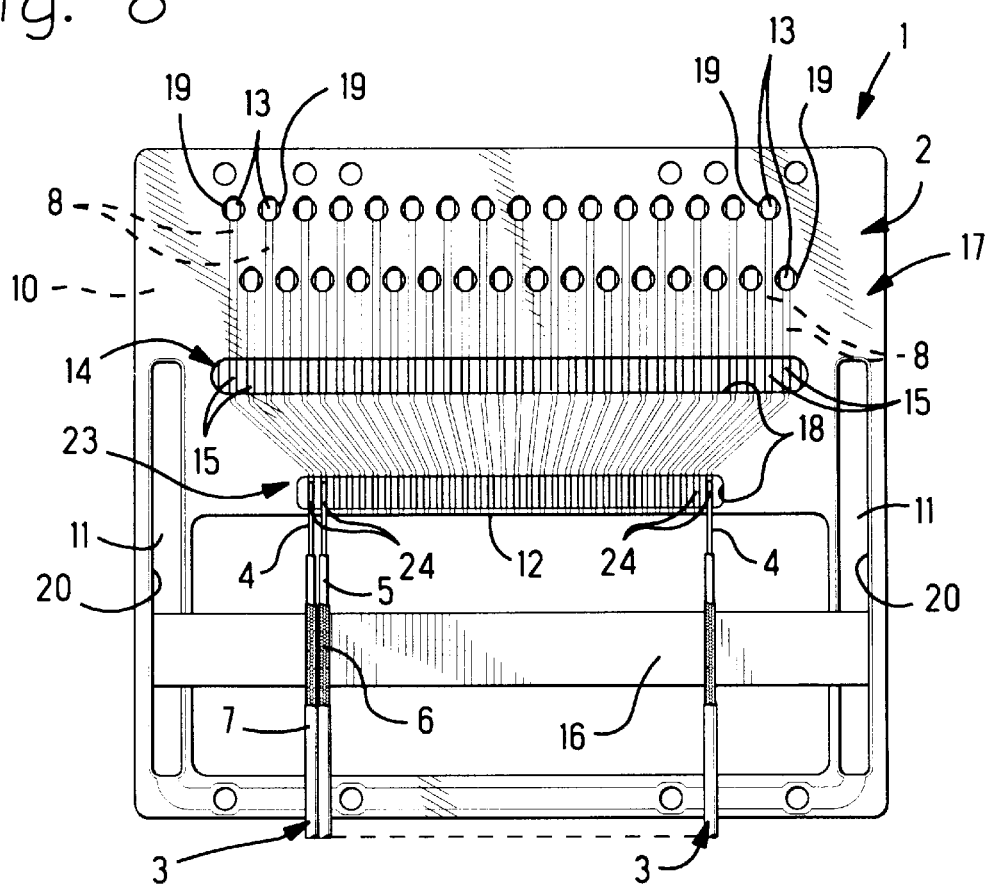

CONNECTOR FOR PITCH SPACED ELECTRICAL CABLES

This Appln claims the benefit of Provisional Appln No. 60/020,672 Jun. 28, 1996.

FIELD OF THE INVENTION

The invention relates to a connector to position an array of multiple electrical cables for connection of the cables to an electrical circuit.

BACKGROUND OF THE INVENTION

U.S. Pat. No. 5,347,711 discloses a connector for positioning an array of multiple electrical cables for connection of the cables to an electrical circuit, wherein the connector comprises, a carrier to which the cables of the array are attached, respective circuit traces on the carrier attached to respective signal transmitting conductors of the cables, and an opening through the carrier at where the signal transmitting conductors project for electrical connection with an electrical circuit positioned at the opening. The patent further describes the opening at where ground conductors of the cables project for connection with a ground portion on the electrical circuit. For example, the ground portion on the electrical circuit can be a ground pad.

The ground portion of the electrical circuit avoids electrical shorting by being spaced apart from other portions of the electrical circuit to which the signal transmitting conductors are to be attached. For different electrical circuits, the corresponding ground portions are at different locations relative to where the signal transmitting conductors are to be attached to the circuits. Accordingly, it has been necessary to manufacture different carriers, for example, carriers with openings at different locations and with different dimensions to align with corresponding ground portions at different locations. A problem resides in having to design and manufacture different carriers to align with such different electrical circuits.

The signal transmitting conductors and the corresponding electrical cables are spaced apart on a pitch spacing that is selected to vary from a narrow pitch spacing, to a pitch spacing of intermediate width, and to a wide pitch spacing. The circuit traces on the carrier are located on a pitch spacing that corresponds to a desired pitch spacing of the signal transmitting conductors and the cables. In the past, It has been necessary to manufacture different carriers, for example, carriers with circuit traces at different pitch spacings to align with corresponding signal transmitting conductors located on different pitch spacings. A problem resides in having to design and manufacture different carriers to align circuit traces with respective signal conductors and cables on different pitch spacings.

SUMMARY OF THE INVENTION

According to the invention, an electrical connector comprises, a carrier on which circuit traces are positioned on a pitch spacing to connect with signal transmitting conductors of electrical cables on a corresponding pitch spacing, and wherein the circuit trace at different locations are spaced apart on different pitch spacings for attachment to respective signal transmitting conductors on corresponding, different pitch spacings.

An advantage resides in a carrier on which circuit traces are positioned at different pitch spacings for attaching signal transmitting conductors of cables on different pitch spacings, to avoid a need for different carriers.

According to an embodiment an electrical connector comprises, a carrier on which circuit traces are positioned relative to electrical cables to connect with signal transmitting conductors of the cables, wherein the circuit traces at one location are spaced apart on a first pitch spacing, and at least a second location on the carrier at which the circuit traces are spaced apart on a second pitch spacing.

An advantage resides in a carrier having circuit traces thereon for attachment to an array of electrical cables, in which the circuit traces provide different locations for attaching respective cables on different pitch spacings.

According to another embodiment, a carrier for positioning an array of electrical cables for connection to an electrical circuit is provided with circuit traces for attachment to the cables, the circuit traces at different locations having different pitch spacings, and the carrier is adapted with an opening capable of being enlarged to remove at least one of the locations. An advantage resides in a carrier having an opening near circuit traces to adapt the circuit traces for attachment with respective electrical cables positioned on different pitch spacing.

According to another embodiment, circuit traces on a carrier are adjacent to an opening, and portions of the circuit traces are removable together with the portion of the carrier to enlarge the opening and to position second portions of the circuit traces adjacent to the opening.

An object of the present invention is to provide a carrier on which circuit traces are positioned to connect with signal transmitting conductors of electrical cables, conductive circuit traces on the carrier to attach to signal transmitting conductors of the cables, and the circuit traces being adapted with different pitch spacings to correspond with pitch spacings of the signal transmitting conductors.

Another object of the invention is to provide a carrier of an electrical connector for positioning an array of electrical cables for connection of the cables to an electrical circuit, wherein conductive circuit traces on the carrier are adapted with different pitch spacings to correspond with the pitch spacings of respective signal transmitting conductors, and wherein the carrier is adapted to be cut away to position different pitch spacings of the circuit traces adjacent to an opening through the carrier, at which opening the conductors of the cable project for connection to an electrical circuit.

Another object is to provide an electrical connector comprising, a carrier, and conductive traces on the carrier to attach to signal transmitting conductors of an array of electrical cables that are positioned by the carrier for connection of the cables to an electrical circuit, the circuit traces being spaced apart on different pitch spacings at different locations on the carrier, to adapt the carrier for positioning respective cables at different pitch spacings.

DETAILED DESCRIPTION OF THE DRAWINGS:

FIG. 5 is a plan view of the cables as shown in FIG. 3 attached to a ground bus;

FIG. 8 is a plan view of a portion of a carrier fabricated from a portion of the carrier as shown in FIG. 6, attached to a ground bus and electrical cables.

DETAILED DESCRIPTION

Figure 3:
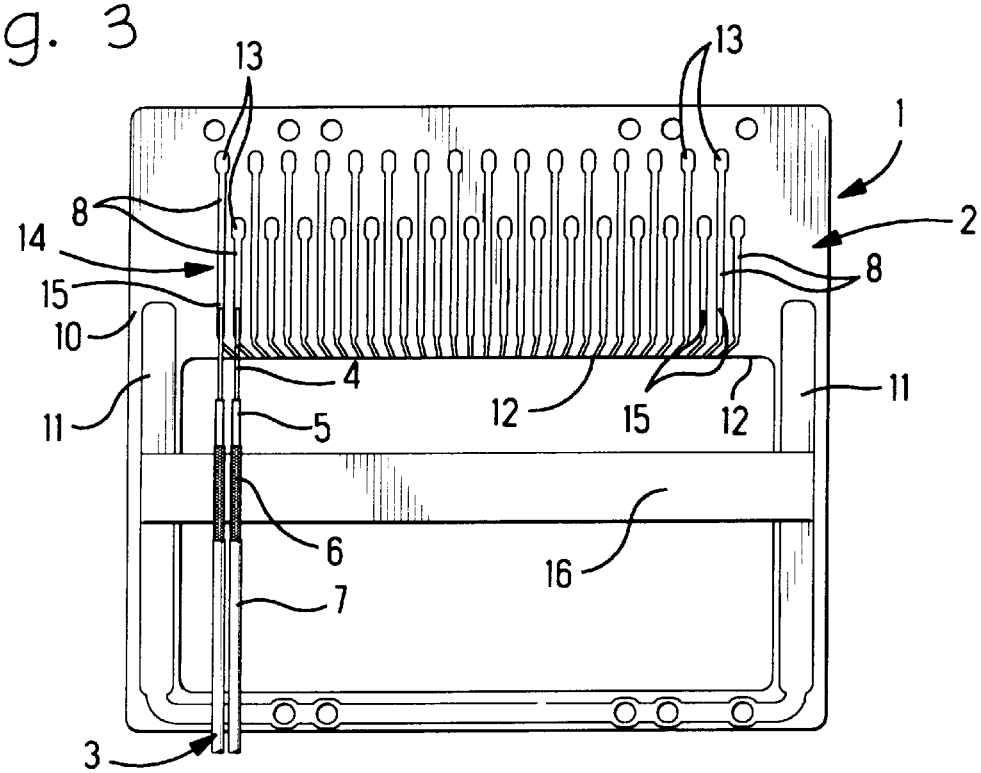
FIG. 3 is a plan view of a carrier attached to electrical cables and a ground bus.

With reference to FIG. 3, an electrical connector (1) comprises, a carrier (2) on which multiple electrical cables (3) are positioned. With reference to FIG. 3, each of the cables (3) is constructed of concentric layers, comprising, a central signal transmitting conductor (4) encircled by concentric insulation (5), in turn, encircled by a concentric conducting shield (6), in turn, encircled by an insulating jacket (7). Each layer of the cable (3) is cut to remove a portion of each layer to expose, a short length of the shield (6), a short length of insulation (5) and a short length of the conductor (4), with each short length protruding from a remainder of the cable (3). The cables (3) are utilized in devices including, for example, medical probes that require many such cables (3) to be connected to corresponding electrical circuits. The connector (1) is so constructed and arranged as to position an array of the electrical cables (3) for connection to corresponding electrical circuits in such devices.

Figure 1:
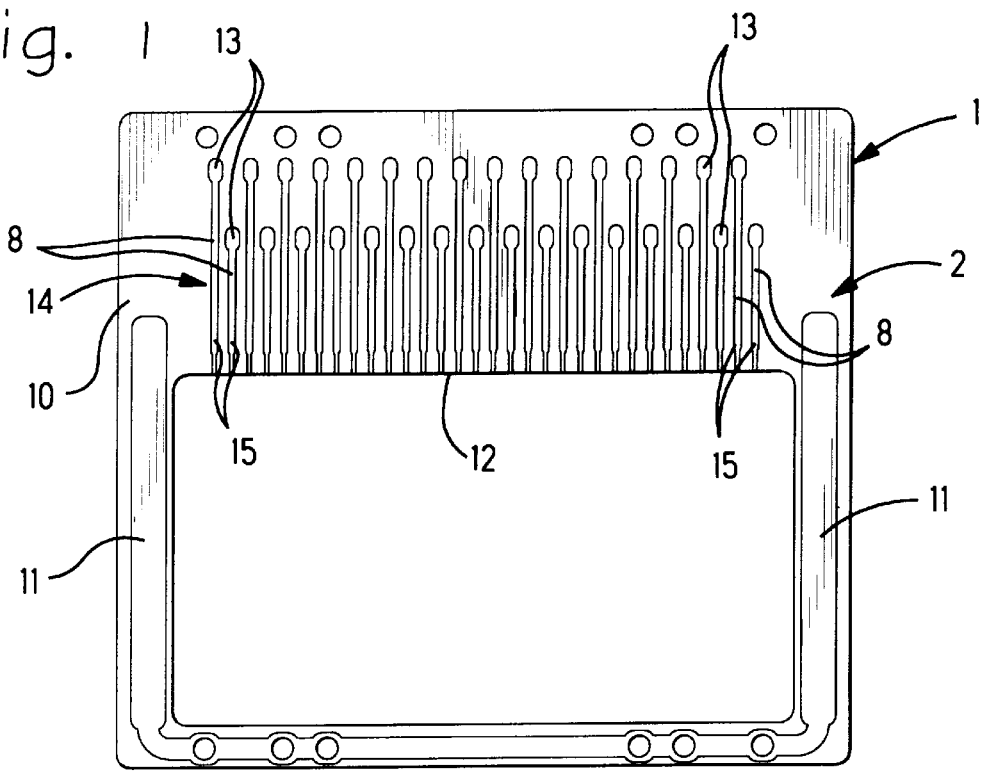
FIG. 1 is a plan view of a carrier, fabricated from a portion of a carrier as shown in FIG. 6, on which are circuit traces to connect with signal transmitting conductors of electrical cables, and at least one elongated ground pad.
Figure 2:
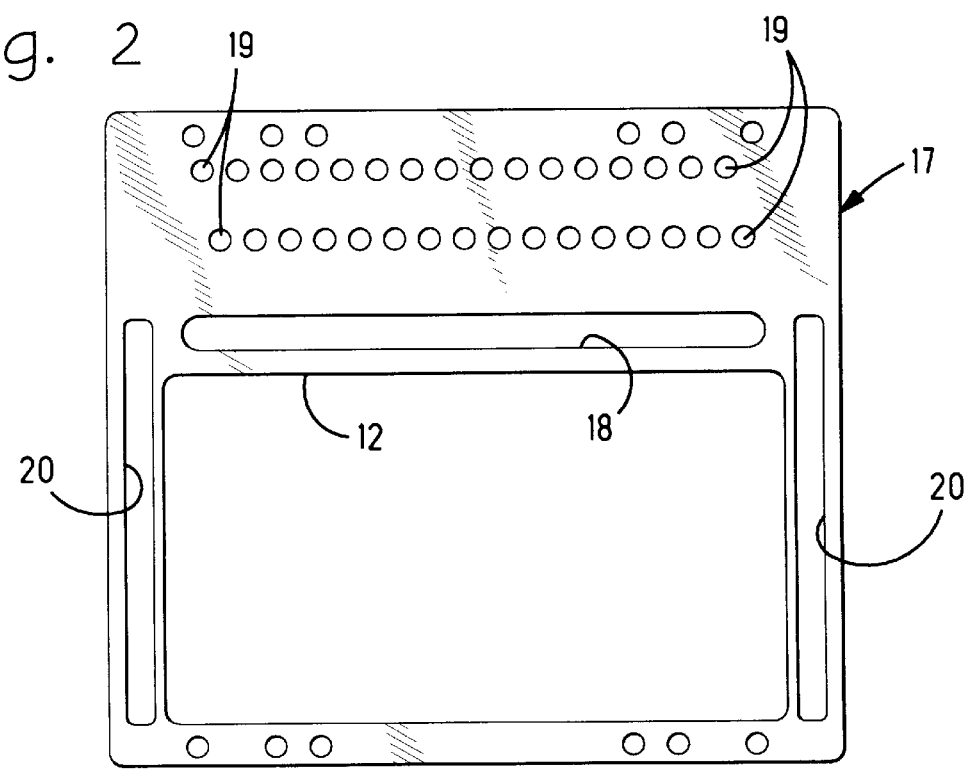
FIG. 2 is a plan view of a portion of a carrier fabricated from a portion of a carrier as shown in FIG. 7, having windows.

The electrical connector (1) provides conducting circuit traces (8) that are positioned to connect with respective signal transmitting conductors (4) of electrical cables (3). With reference to FIGS. 1–3, the electrical connector (1), FIG. 3, comprises, a carrier (2) fabricated by an insulating portion (10) on which are located an array of the conducting circuit traces (8). The insulating portion (10) comprises a layer of thin, flexible material such as KAPTON, a registered trademark of E.I. duPont DeNemours & Co. The circuit traces (8) are narrow conducting circuit paths on the insulating portion (10). In addition to the circuit traces at least one, and, more specifically, a pair of, conducting and elongated ground pads (11) are provided on the same side of the insulating portion (10) as the circuit traces (8). For example, the circuit traces (8) and the ground pads (11) are fabricated according to known manufacturing processes for applying conducting paths on a circuit board. Such processes include, additive processes such as plating, or subtractive processes such as etching.

The circuit traces (8) are adjacent one another on the same surface of the insulation layer (10). The circuit traces (8) extend away from an opening (12) through the insulating portion (10) to respective test pads (13) that are provided as enlarged portions on the circuit traces (8). The circuit traces (8) extend toward the opening (12) through the insulating portion (10). In at least one location (14), for example, a location (14) adjacent to the opening (12), portions (15) of the circuit traces (8) are spaced apart on a pitch spacing corresponding to a pitch spacing of the multiple electrical cables (3) that are positioned on the carrier (2). More particularly, the circuit traces (8) and the parallel conductors (4) of the array of cables (3) are on the same corresponding pitch spacing the minimum of which is mandated by the size of the cables in the array. The portion (15) of the circuit traces (8) are attached by solder joints to respective conductors (4) of the cables (3) in the array. Thereby the traces (8) are joined to respective conductors (4) of the cables (3), and position the conductors (4) on a desired pitch spacing.

As shown in FIG. 3, the conductors (4) project away from the circuit traces (8) toward the opening (12), at which opening (12), the conductors (4) project for electrical connection with an electrical circuit positioned at the opening (12). Details of the electrical circuit are disclosed in U.S. Pat. No. 5,347,711, incorporated herein by reference. The opening (12) is positioned relative to the electrical circuit, with the conductors (4) at the opening (12) being positioned adjacent to the electrical circuit. The opening (12) provides a clearance space in which solder joints are fabricated in a known manner as disclosed in U.S. Pat. No. 5,347,711, to attach the conductors (4) to respective portions of the electrical circuit.

Figure 4:
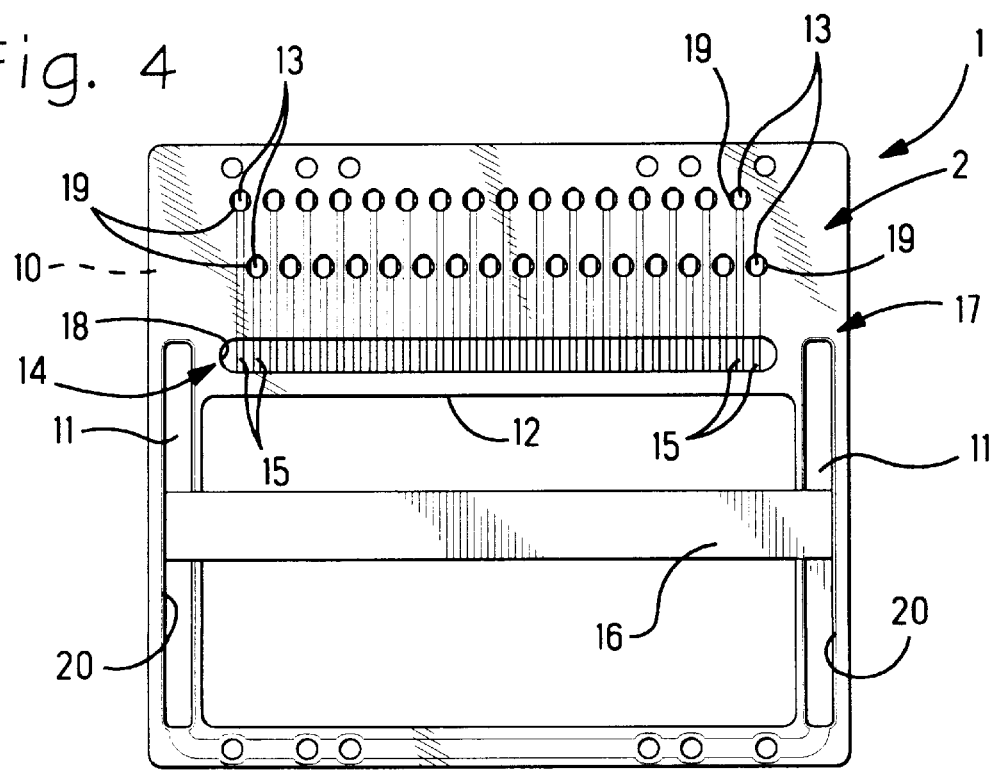
FIG. 4 is a plan view of the carrier as shown in FIG. 3 with the ground bus attached.

As shown in FIGS. 3–5, a conducting ground bus (16) is a thin and flexible strip, for example, a strip of thin copper coated with solidified solder that is capable of being reflowed to produce solder joints. The ground bus (16) is separate from the insulating portion (10) of the carrier (2). The ground bus (16) geometry is configured for compatibility with the geometry of the electrical circuit and a circuit board to which the carrier (2) is to be connected. For example, the carrier (2) can connect to an electrical circuit on a front side of a circuit board. The ground bus (16) may extend beyond outer edges of the carrier (2) to become folded around a back side of the circuit board, such that the ground bus (16) may connect to a ground portion of the electrical circuit that extends on a back side of the circuit board, for example, a ground portion in the form of a ground plane on a back side of a circuit board. Further the ground bus (16) extends transversely across the exposed shields (6) of the cables (3) in the array. The exposed shields (6) are side to side in a row along the ground bus (16). The ground bus (16) and the exposed shields (6) are electrically connected by solder joints. The ground bus (16) can be attached, by solder joints, first to one of the ground pads (11), FIG. 4, or first to the shields (6) of the cables (3), FIG. 5.

The ground bus (16) is adjusted in position relative to the carrier (2), as shown in either FIG. 4, or FIGS. 3 and 5 such that the exposed conductors (4) of the cables (3) become substantially aligned with respective circuit traces (8), FIG. 3, for connection thereto afterward by solder joints. If the ground bus (16) has been earlier attached as shown in FIG. 4, for example, by a solder joint to at least one of the ground pads (11) that overlap the ground bus (16), the corresponding solder joint is reflowed to a fluent state to allow repositioning of the ground bus (16).

Each of the ground pads (11) extends near opposite side edges of the opening (12). Each of the ground pads (11) are elongated in the same direction as the axes of the cables (3) in the array. The ground bus (16), alone, or together with the cables (3) having their shields (6) connected to the ground bus (16), can be adjusted in position along each of the elongated ground pads (11), for example, until the exposed central conductors (4) of the cables (3) project a desired amount at the opening (12). Accordingly, each of the lengthy ground pads (11) provides a desired feature that permits pitch spacing adjustment of the cables (3) relative to the opening (12). Once the ground bus (16) is positioned, the ground bus (16) is attached and electrically connected to at least one of the ground pads (11) by a solder joint. Connection to one or both ground pads (11) by solder joints where they overlap the ground bus (16) provides redundant electrical connections and a shorter circuit distance to the electrical circuit for the lengthy ground bus (16). The ground bus (16) is attached to the carrier (2) to anchor the cables (3). For example, the ground bus (16) extends across the opening (12). The conductors (4) of the anchored cables (3) are then straightened and then connected to the circuit traces (8). With the carrier (2) attached to the conductors (4) and to the ground bus (16), the carrier (2) is positioned in proper location over an electrical circuit for connection thereto. For example, the carrier (2) can be turned upside down to face the conductors (4) and the ground pads (11) toward an electrical circuit.

The conductors (4) engage the electrical circuit and can be connected thereto by solder joints. The ground bus (16) can engage a ground portion of the electrical circuit and is readily connected to the ground portion of the electrical circuit as determined by the configuration of the ground bus (16) for compatibility with the electrical circuit. For example, each of the ground pads (11) has a configuration that is capable of reaching and connecting with a ground portion of an electrical circuit located at different locations, to avoid a need for different carriers (2). Further, for example, the ground pads (11) extend on a flexible portion (10) of the carrier (2) that can be flexed, and even doubled back on itself, to face each of the ground pads (11) toward an electrical circuit, and to attach one or both pads (11) to a ground portion of the electrical circuit, at where the corresponding pad (11) reaches to engage the ground portion. At least one of the ground pads (11) can be joined to the ground portion by a solder joint.

When removal and discard of the carrier (2) is desired, following solder attachment of the conductors (4) and at least one of the ground pads (11), care must be taken the cut away each of the solder attached ground pads (11) from a remainder of the carrier (2). The carrier (2) is then easily cut away from the conductors (4) and the solder attached ground pads (11) by a knife or by shears.

When the ground bus (16) as well as the conductors (4) are in correct positions for direct attachment to the electrical circuit, the ground bus (16) can be severed at its opposite ends to detach it from both of the ground pads (11). Latent solder on the ground bus (16) can be reflowed to connect the ground bus (16) to the ground portion of the electrical circuit. The carrier (2) is removed and discarded following solder attachment of the conductors (4) and the ground bus (16) to the electrical circuit.

With reference to FIG. 2, a second insulating portion (17) of the carrier (2) comprises a thin and flexible material provided with a layer of nonconducting adhesive on one side. The second insulating portion (17) is intended to be laminated to the carrier by the adhesive. At least one window (18) through the second insulation portion (17) registers with and exposes the portions (15) of the circuit traces (8) on the desired pitch spacings, FIG. 3. Multiple additional windows (19) through the second insulating portion (17) register with and expose the multiple test pads (13) for connection of test probes. Duplicate opening (12) through the second insulating portion (17) is in registration with the first opening (12). Additional windows (20) through the second insulation portion (17) register with respective ground pads (11). The portions (15) of the circuit traces (8) and the ground pads (11) that are exposed at the windows (18,20) are tinned, meaning that they are coated with solidified solder that can be heated and reflowed to a fluent state to assure proper solder wetting and joining during the formation of solder joints. The second insulation portion (17) provides a protecting cover for the circuit traces (8), and confines the solder within the respective windows (18,20).

Figure 6:
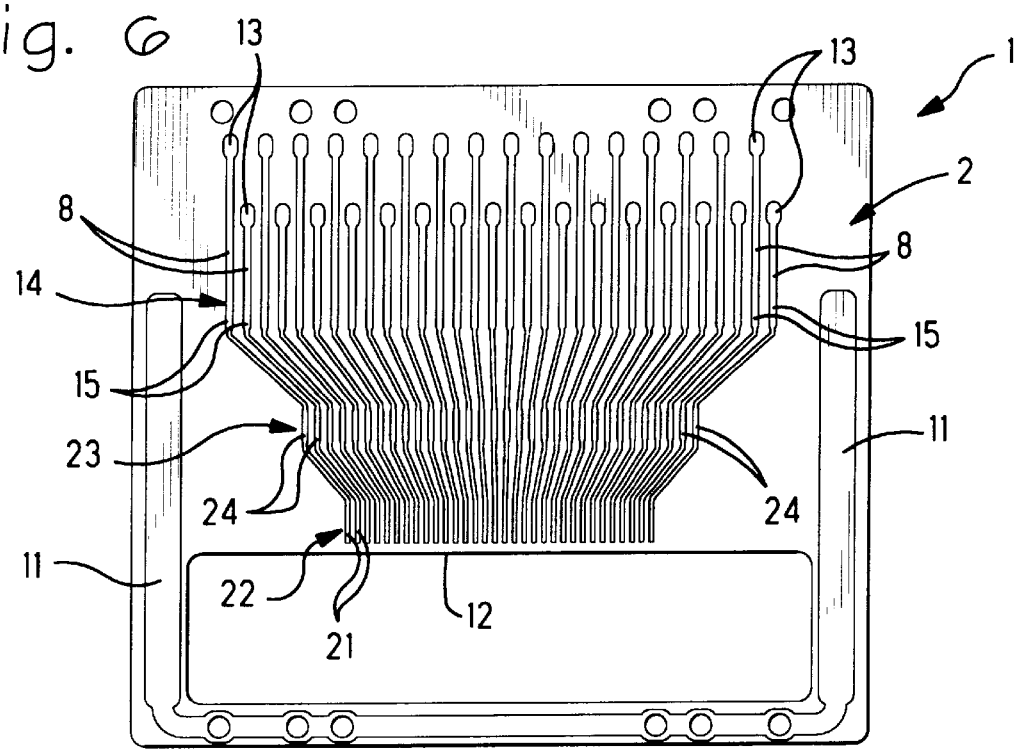
FIG. 6 is a plan view of a carrier, as shown in FIG. 1, together with additional circuit traces.
Figure 7:
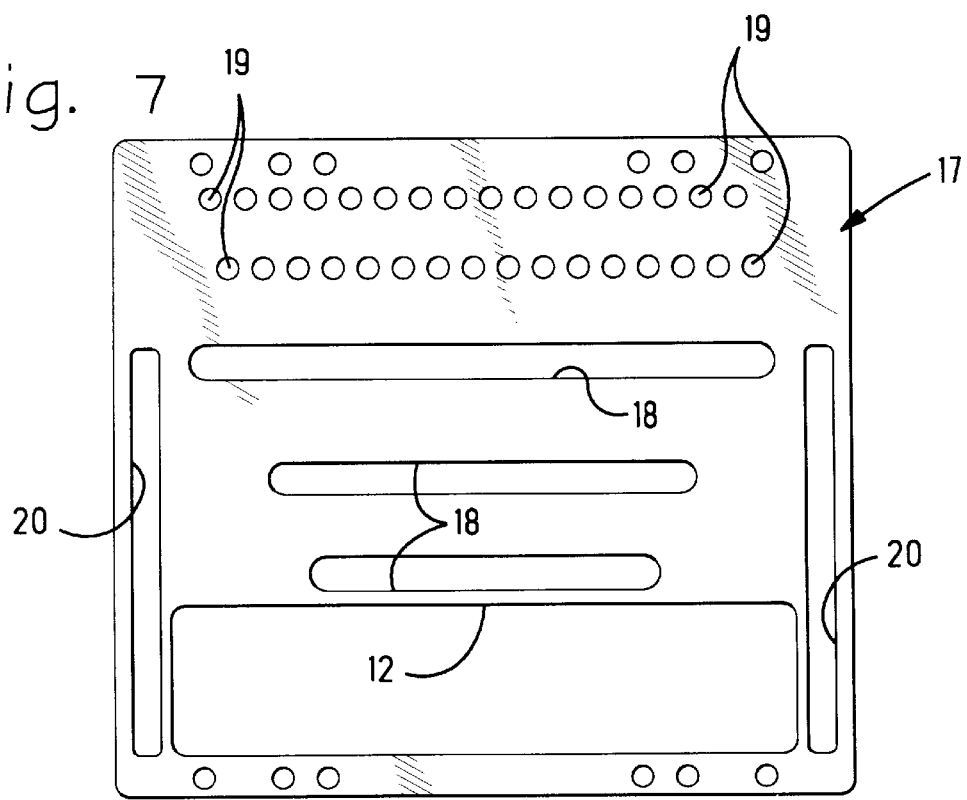
FIG. 7 is a plan view of a portion of the carrier, as shown in FIG. 2, together with additional windows.

With reference to FIGS. 6 and 7, the carrier (2) is larger in initial area than as described in conjunction with FIGS. 1–4. Portions (21) of the circuit traces (8) are at a first location (22) wherein the pitch spacing is narrow. The circuit traces (8) diverge toward at least a second location (23) wherein portions (24) of the traces (8) are on a pitch spacing of intermediate width. The circuit traces (8) diverge toward the location (14) where the portions of the traces (8) are on a wide pitch spacing. The circuit traces (8) provide the locations (14,22,23) for attaching respective cables (3) on different pitch spacings.

The carrier (2) as shown in FIG. 1 is obtained from the carrier (2) as shown in FIG. 6, by cutting away a portion of the carrier (2) as shown in FIG. 6, removing the first location (22) and the second location (23), and enlarging the opening (12). Thus, in FIG. 1, the carrier (2) is adapted to attach the cables (3) on a wide pitch spacing. With reference to FIG. 8, the corresponding carrier (2) is obtained from the carrier (2) as shown in FIG. 6, by cutting away a portion of the carrier (2) as shown in FIG. 6, removing the first location (22), enlarging the opening (12) and leaving the second location (23) and the third location (14). Thus, the carrier (2) in FIG. 8 is adapted to attach to the cables (3) on an intermediate width pitch spacing at the second location (23). Thus, the opening (12) is enlarged to position the desired portions (15,21,24) of the circuit traces (8) adjacent to the opening (12). For example, the portion (21) of the circuit traces (8) at location (22) are on a pitch spacing of 0.014 inch and are each 0.006 inch wide. The portions (23) of the circuit traces (8) at location (24) are on a pitch spacing of 0.018 inch and are each 0.008 inch wide. The portion (15) of the circuit traces (8) are on a pitch spacing of 0.025 inch and are each 0.010 inch wide. For example, the conductor (4) of the cables (3) can range from 28 AWG, American Wire Gauge, to 42 AWG. After the conductors (4) are connected by respective solder joints to an electrical circuit that is positioned at the opening (12), distal portions of the conductors (4) that are attached to the circuit traces (8) can be severed and removed from the remainder of the cables (3), together with a part of the carrier (2) on which the circuit traces (8) appear. A remainder of the carrier (2) on which the pads (11) appear can remain.

With reference to FIG. 7, the second insulation portion (17) is larger in initial area than as described in conjunction with FIG. 2, and is provided with multiple separate windows (18) that are in registration with tinned circuit traces at respective locations (14,22,24) for attaching respective cables (3). The second insulation portion (17) can be cut away to remove selected windows (18), so as to adapt the second insulation portion (17) for the carrier (2) as shown in either of FIGS. 1, 6 and 8. The second insulation portion (17) is adapted for being laminated together with the first insulation portion (10), to be followed by cutting away portions of both of them.

Other embodiments and modifications of the invention are intended to be covered by the spirit and scope of the appended claims.

What is claimed is:

1. An electrical connector for positioning an array of electrical cables for connection of the cables to an electrical circuit, the connector comprising: a carrier, conducting circuit traces on the carrier to attach to signal transmitting conductors of the cables, the circuit traces having pads for connection to an electrical circuit, and the circuit traces being adapted with different pitch spacings to correspond with pitch spacings of the signal transmitting conductors, wherein, first portions of the circuit traces at one location being spaced apart on a first pitch spacing for attachment to respective signal transmitting conductors on a corresponding first pitch spacing, and at least a second location at which second portions of the circuit traces are spaced apart on a second pitch spacing for attachment to respective signal transmitting conductors on a corresponding second pitch spacing, the first portions of the circuit traces being located between an opening through the carrier and the second portions of the circuit traces, the first portions of the circuit traces being on a removable portion of the carrier, and the first portions of the circuit traces being removable together with the removable portion of the carrier to enlarge the opening and position the second portions of the circuit traces adjacent the opening, whereby the second portions of the circuit traces are located closer to the opening, in the absence of the removable first portions of the circuit traces, for connection to respective signal conductors on a corresponding second pitch spacing.

2. An electrical connector as recited in claim 1 and further comprising: an insulating portion superposed with the carrier, and windows through the insulating portion in registration with respective first and second portions of the circuit traces.

3. An electrical connector as recited in claim 1, and further comprising: at least a third location on the carrier at which third portions of the circuit traces are spaced apart on a third pitch spacing for connection to respective signal transmitting conductors on a corresponding third pitch spacing.

4. An electrical connector as recited in claim 3 wherein, said first and second portions of the circuit traces are removable together with a corresponding portion of the carrier to enlarge the opening and position the third portions of the circuit traces adjacent the opening, whereby the third portions of the circuit traces are located closer to the opening, in the absence of the removable first and second portions of the circuit traces, for connection to respective signal conductors on a corresponding third pitch spacing.

5. An electrical connector for positioning an array of electrical cables for connection of the cables to an electrical circuit, the connector comprising: a carrier, conducting circuit traces on the carrier to attach to signal transmitting conductors of the cables, the circuit traces having pads for connection to an electrical circuit, and the circuit traces being adapted with different pitch spacings to correspond with pitch spacings of the signal transmitting conductors, wherein, first portions of the circuit traces at one location being spaced apart on a first pitch spacing for attachment to respective signal transmitting conductors on a corresponding first pitch spacing, at least a second location at which second portions of the circuit traces are spaced apart on a second pitch spacing for attachment to respective signal transmitting conductors on a corresponding second pitch spacing, and conducting ground pads on the carrier, the ground pads extending along opposite sides of the opening.

6. An electrical connector as recited in claim 5, and further comprising: an insulating portion superposed with the carrier, windows through the insulating portion in registration with respective first and second portions of the circuit traces, and additional windows through the insulating portion in registration with respective ground pads.

7. An electrical connector as recited in claim 6 wherein, the first portions of the circuit traces are adjacent to the opening, said first portions of the circuit traces are removable together with a portion of the carrier and a portion of the insulating portion to enlarge the opening, and further comprising, test pads on the circuit traces, and further windows in the insulating portion in registration with respective test pads.

\* \* \* \* \*